United States Patent
Takigawa et al.

(10) Patent No.: US 10,643,127 B2
(45) Date of Patent: May 5, 2020

(54) MACHINE LEARNING APPARATUS FOR LEARNING CONDITION FOR STARTING LASER MACHINING, LASER APPARATUS, AND MACHINE LEARNING METHOD

(71) Applicant: FANUC CORPORATION, Yamanashi (JP)

(72) Inventors: Hiroshi Takigawa, Yamanashi (JP); Hiroyuki Yoshida, Yamanashi (JP); Hisatada Machida, Yamanashi (JP); Michinori Maeda, Yamanashi (JP); Ryusuke Miyata, Yamanashi (JP); Akinori Ohyama, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 164 days.

(21) Appl. No.: 15/411,232

(22) Filed: Jan. 20, 2017

(65) Prior Publication Data
US 2017/0220927 A1    Aug. 3, 2017

(30) Foreign Application Priority Data

Jan. 28, 2016    (JP) .................................. 2016-014430

(51) Int. Cl.
*B23K 37/00*    (2006.01)
*B23K 26/70*    (2014.01)
(Continued)

(52) U.S. Cl.
CPC ............ *G06N 3/08* (2013.01); *B23K 26/032* (2013.01); *B23K 26/21* (2015.10); *B23K 26/38* (2013.01);
(Continued)

(58) Field of Classification Search
None
See application file for complete search history.

(56) References Cited

U.S. PATENT DOCUMENTS 4,622,971 A * 11/1986 Yamamoto ............. A61B 18/20
                                                    219/121.61
5,059,760 A * 10/1991 Iehisa ................... B23K 26/032
                                                    219/121.62
(Continued)

FOREIGN PATENT DOCUMENTS

DE    102014212682 A1    1/2016
JP    11-170074 A    6/1999
(Continued)

OTHER PUBLICATIONS

Bloom, A. et al., "Process spread reduction of laser microspot welding of thin copper parts using real-time control," Proc. SPIE 4977, Photon Processing in Microelectronics and Photonics II (Oct. 17, 2003) pp. 493-507. (Year: 2003).*

(Continued)

*Primary Examiner* — Eric Nilsson
*Assistant Examiner* — Brian M Smith
(74) *Attorney, Agent, or Firm* — RatnerPrestia

(57) ABSTRACT

The machine learning apparatus includes: a state data observing unit which observes state data of the laser apparatus, including data output from a reflected light detecting unit for measuring a reflected light amount; an operation result acquiring unit which acquires a success/failure result indicating whether the machining has been started successfully by the laser beam output from a laser oscillator; a learning unit which learns light output command data by associating the light output command data with the state data of the laser apparatus and the success/failure result of the machining start; and a decision making unit which determines the light output command data by referring to the light output command data learned by the learning unit.

17 Claims, 10 Drawing Sheets

(51) Int. Cl.
*B23K 26/38* (2014.01)
*B23K 26/21* (2014.01)
*B23K 26/03* (2006.01)
*H01S 5/00* (2006.01)
*H01S 3/10* (2006.01)
*G06N 20/00* (2019.01)
*G06N 3/08* (2006.01)
*H04L 29/08* (2006.01)

(52) U.S. Cl.
CPC .......... *B23K 26/702* (2015.10); *B23K 26/705* (2015.10); *B23K 26/707* (2015.10); *B23K 37/006* (2013.01); *G06N 20/00* (2019.01); *H01S 5/0021* (2013.01); *H04L 67/10* (2013.01); *H01S 3/10069* (2013.01)

(56) References Cited

U.S. PATENT DOCUMENTS

| | | | | |
|---|---|---|---|---|
| 7,630,421 | B2* | 12/2009 | Kobayashi | B23K 26/032 250/205 |
| 10,115,190 | B2 | 10/2018 | Hallasch et al. | |
| 2002/0059907 | A1* | 5/2002 | Thomas | F01B 3/04 123/43 AA |
| 2003/0234240 | A1* | 12/2003 | Yamazaki | B23K 26/702 219/121.62 |
| 2005/0178749 | A1* | 8/2005 | Yamazaki | B23K 26/03 219/121.62 |
| 2006/0142893 | A1* | 6/2006 | Yasugi | G05B 19/4065 700/174 |
| 2011/0235663 | A1* | 9/2011 | Akins | G03F 7/70025 372/38.01 |
| 2011/0278277 | A1* | 11/2011 | Stork Genannt Wersborg | B23K 26/02 219/209 |
| 2012/0120091 | A1* | 5/2012 | Koudijs | A61B 90/10 345/589 |
| 2013/0126492 | A1* | 5/2013 | Mori | B23K 26/00 219/121.83 |
| 2014/0129703 | A1* | 5/2014 | Patel | G06Q 30/0625 709/224 |
| 2015/0379072 | A1* | 12/2015 | Dirac | G06N 99/005 707/693 |
| 2016/0016250 | A1* | 1/2016 | Denis | B23K 9/095 219/130.1 |
| 2017/0043431 | A1* | 2/2017 | Kuba | B23K 26/032 |

FOREIGN PATENT DOCUMENTS

| | | |
|---|---|---|
| JP | 2000-126880 A | 5/2000 |
| JP | 2004025204 A | 1/2004 |
| JP | 2007-030032 A | 2/2007 |
| JP | 2007-042981 A | 2/2007 |
| WO | WO-2011083087 A1 * | 7/2011 ........... B23K 26/032 |

OTHER PUBLICATIONS

Luzeaux, D. et al., "Process control and machine learning: Rule-based incremental control," IEEE Trans. on Automatic Control, vol. 39, No. 6 (Jun. 1994) pp. 1166-1171. (Year: 1994).*

Ahn, H-S. et al., "Iterative learning control: Brief survey and categorization," IEEE Trans. on Systems, Man, and Cybernetics—Part C, vol. 37, No. 6 (Nov. 2007) pp. 1099-1121 (Year: 2007).*

* cited by examiner

MACHINE LEARNING APPARATUS FOR LEARNING CONDITION FOR STARTING LASER MACHINING, LASER APPARATUS, AND MACHINE LEARNING METHOD

BACKGROUND OF THE INVENTION

1. Field of the Invention

The present invention relates to a machine learning apparatus for learning a condition for starting laser machining, and to a laser apparatus and a machine learning method. More particularly, the invention relates to a machine learning apparatus that learns light output command data for starting laser machining of a workpiece without causing damage to a laser oscillator or a laser optical system due to reflected laser beam or causing stoppage of laser oscillation due to generation of an alarm, and to a laser apparatus and a machine learning method.

2. Description of the Related Art

Since prevention of damage to a laser oscillator or a laser optical system due to reflected light is an important issue in designing a laser apparatus, a variety of related techniques have been reported.

For example, Japanese Unexamined Patent Publication No. 2007-30032 discloses a technique for monitoring whether the surface state of a workpiece is normal or not by using a laser light measuring unit and a reflected light measuring unit. Further, Japanese Unexamined Patent Publication No. 2007-42981 discloses an optical-fiber laser equipped with a pump-light source control means for preventing amplification of returned light by reducing the output of the pump-light source when the intensity of the returned light exceeds a predetermined value.

Further, Japanese Unexamined Patent Publication No. H11-170074 discloses a laser machining apparatus which is equipped with a reflected light detector and a reflected light intensity calculating unit for calculating reflected light intensity immediately after reflection by using a reflected light distribution table, and which controls a laser oscillator based on a comparison made between the reflected light intensity calculated by the reflected light intensity calculating unit and its reference value. Further, Japanese Unexamined Patent Publication No. 2000-126880 discloses a laser machining apparatus which controls laser beam based on a comparison made between the amount of increase in reflected light intensity, mathematically obtained from the reflected light intensity, and a predetermined reference value.

SUMMARY OF THE INVENTION

However, in the above prior art laser apparatus, if the amount of reflected light is monitored, the monitored light amount is not used for controlling the light output, or the light output is only reduced when the amount of reflected light increases, or the light output is only controlled based on the data obtained by converting the amount of reflected light using a simple mathematical equation. There is no mention of how the laser beam output condition should be set based on the detected amount of reflected light so that machining can be started with a high probability of success by forming tiny pits or holes while maintaining the amount of reflected light to or below an allowable level, nor is there disclosed any technique that can derive an appropriate light output condition, partly because such conditions can be affected by the material, temperature, and surface state of the workpiece.

As a result, if the amount of reflected light is monitored, it may not be possible to quickly determine the laser beam output condition for starting machining, or an alarm indicating an excessive amount of reflected light may be issued repeatedly because of poor reproducibility. This can result in an inability to start the machining in a short time or can lead to an inability to start machining. Furthermore, to increase the success rate of being able to start machining, a human has had to accumulate an enormous amount of data by repeating a trial and error procedure and thereby searching for an optimal laser beam output condition for being able to start machining.

In Japanese Unexamined Patent Publication No. 2007-30032, no description is given of how the result of monitoring the surface state is to be fed back to the laser beam output condition, nor is there disclosed any method of starting machining by reducing the amount of reflected light to a prescribed level. In Japanese Unexamined Patent Publication No. 2007-42981, there can occur cases where machining cannot be started if the output of the pump-light source is only reduced. However, Japanese Unexamined Patent Publication No. 2007-42981 does not provide a solution method for addressing such a problem.

Further, in Japanese Unexamined Patent Publication Nos. H11-170074 and 2000-126880, if the laser oscillator is controlled based on a comparison made between the reflected light intensity and its reference value, this does not lead to starting machining by reducing the level of the reflected light, and the problem is not solved.

The present invention has been devised in view of the above circumstances, and an object of the invention is to provide a machine learning apparatus that can learn, without human intervention, a laser beam output condition optimal for starting laser machining in the shortest possible time while maintaining the amount of reflected light to or below a predetermined level when starting the machining, and also to provide a laser apparatus and a machine learning method.

To achieve the above object, according to a first invention, there is provided, a machine learning apparatus for learning light output command data containing a light output command to be issued to the laser power supply unit to start the machining, for use in a laser apparatus comprising at least one laser oscillator for performing machining such as cutting or welding by applying laser beam to a workpiece and at least one or more laser power supply units for supplying power to the laser oscillator, the machine learning apparatus comprising: a state data observing unit which observes state data of the laser apparatus, including data output from an output light detecting unit for measuring an output light amount which is the amount of the laser beam output from the laser oscillator by passing through a laser optical system, and data output from a reflected light detecting unit for measuring a reflected light amount which is the amount of reflected light, the reflected light being the laser beam reflected from a surface of the workpiece back into the laser oscillator and/or the laser optical system; an operation result acquiring unit which acquires a success/failure result indicating whether the machining has been started successfully by the laser beam that the laser oscillator output based on the light output command data; a learning unit which receives an output from the state data observing unit and an output from the operation result acquiring unit, and learns the light output command data containing the light output command to the laser power supply unit by associating the light output command data with the state data of the laser apparatus and the success/failure result of the machining start; and a decision making unit which determines the light output command data containing the light output command to the laser power supply by referring to the light output command data learned by the learning unit, and wherein the machine learning apparatus learns the light output command data for starting the machining on the workpiece within a predefined time period while satisfying a condition that the reflected light amount does not exceed a second predetermined level which is set higher than a first predetermined level.

According to a second invention, in the first invention, when the reflected light amount obtained from the output data of the reflected light detecting unit has reached the first predetermined level, a command for temporarily shutting off or reducing the laser beam output is immediately issued to the laser power supply unit even when the laser power supply unit is in the process of executing the light output command, and the decision making unit re-outputs new next light output command data.

According to a third invention, in the first or second invention, the second predetermined level for the reflected light amount is set lower than an alarm level corresponding to a light amount above which the reflected light amount is highly likely to damage the laser oscillator and/or the laser optical system.

According to a fourth invention, in any one of the first to third inventions, the decision making unit outputs the light output command data by determining the light output command data substantially in succession in a time series manner, at least during the predefined time period, until succeeding in starting the machining.

According to a fifth invention, in any one of the first to fourth inventions, when determining the light output command data, if there is any previous light output command data output before that light output command data, the output data of the reflected light detecting unit obtained for the laser beam output based on the previous light output command data is utilized in determining the light output command data.

According to a sixth invention, in any one of the first to fifth inventions, the operation result acquiring unit utilizes the output data of the reflected light detecting unit.

According to a seventh invention, in any one of the first to sixth inventions, the success/failure result of the machining start to be acquired by the operation result acquiring unit is given in the form of a result indicating whether or not the light output command data that substantially coincides with the light output command data necessary or suitable for the machining of the workpiece has been successfully output within the predefined time period.

According to an eighth invention, in any one of the first to seventh inventions, the operation result acquiring unit acquires at least one of results which include the success or failure of the machining start, the time required to start the machining, the number of times that, or the frequency with which, the reflected light amount reached the first predetermined level, and an amount corresponding to a time-integrated value of an amount by which the reflected light amount exceeded the first predetermined value.

According to a ninth invention, in any one of the first to eighth inventions, the learning unit includes a reward calculating unit for calculating a reward based on an output of the operation result acquiring unit, and a value function that determines a value of the light output command data, and further includes a value function updating unit for updating the value function based on the reward.

According to a tenth invention, in any one of the first to eighth inventions, the learning unit includes a learning model for learning the light output command, and further includes an error calculating unit for calculating an error based on an output of the operation result acquiring unit and on the learning model, and a learning model updating unit for updating the learning model based on the error.

According to an 11th invention, in any one of the first to tenth inventions, the machine learning apparatus includes a neural network.

According to a 12th invention, in any one of the first to 11th inventions, the state data input to the state data observing unit and/or the light output command data output from the decision making unit include at least one of the following: laser beam output, peak output, pulse width, pulse spacing, repetition frequency, number of repetitive pulses, assist gas spraying conditions, transmittance, focal length, and F value of the laser optical system, spot size of the laser beam focused on the surface of the workpiece, relative positional relationship between the surface of the workpiece and the focused point of the laser beam, incident angle of the laser beam relative to the surface of the workpiece, temperature of the workpiece, ambient temperature, and ambient humidity.

According to a 13th invention, there is provided a laser apparatus equipped with the machine learning apparatus of any one of the first to 12th inventions, comprising: the laser oscillator; the laser power supply unit; the laser optical system; the output light detecting unit; the reflected light detecting unit; and a control apparatus which controls the laser oscillator, the laser power supply unit, the laser optical system, the output light detecting unit, and the reflected light detecting unit independently of each other.

According to a 14th invention, in the 13th invention, the laser apparatus includes at least two or more reflected light detecting units, and at least one reflected light detecting unit for detecting each of a plurality of reflected lights propagating through different light paths.

According to a 15th invention, in the 13th or 14th invention, the laser apparatus includes a light source different from the laser oscillator, a light detector for detecting light from the light source, and an optical system through which the light from the light source is applied to the workpiece and through which the light reflected from the surface of the workpiece is incident on the light detector, so that a state of the light reflected from the workpiece can be observed even when the laser beam from the laser oscillator is not output, and a result of the observation is input as one of the state data to the state data observing unit.

According to a 16th invention, in any one of the 13th to 15th inventions, the laser apparatus includes an infrared detecting unit and/or a plasma light detecting unit for detecting infrared and/or plasma light radiated from near a designated position on the workpiece where the laser beam is applied or is intended to be applied, and data acquired by the infrared detecting unit and/or the plasma light detecting unit is input as one of the state data to the state data observing unit.

According to a 17th invention, in any one of the 13th to 16th inventions, there exist a plurality of the laser apparatus, and a plurality of the machine learning apparatus, which are provided one for each of the laser apparatus, are configured to share or exchange data with each other via communication media.

According to an 18th invention, in the 17th invention, the machine learning apparatus resides in a cloud server.

According to a 19th invention, there is provided a machine learning method for learning light output command data which contains a light output command to the laser power supply unit for starting the machining of the workpiece by the laser beam within the predefined time period while satisfying the condition that the reflected light amount does not exceed a second predetermined level, the machine learning method comprising: observing state data of the laser apparatus, including the data output from the output light detecting unit for measuring the output light amount and the data output from the reflected light detecting unit for measuring the reflected light amount; acquiring a success/failure result indicating whether the machining has been started successfully by the laser beam; receiving the observed state data of the laser apparatus and the acquired success/failure result of the machining start effected by the laser beam; and learning the light output command data containing the light output command to the laser power supply unit by associating the light output command data with the state data of the laser apparatus and the success/failure result of the machining start.

According to a 20th invention, there is provided a machine learning method for learning light output command data which contains a light output command to the laser power supply unit for starting the machining of the workpiece by the laser beam within the predefined time period while satisfying the condition that the reflected light amount does not exceed a second predetermined level, the machine learning method comprising: observing state data of the laser apparatus, including the data output from the output light detecting unit for measuring the output light amount and the data output from the reflected light detecting unit for measuring the reflected light amount; acquiring a result for the light output command data, the result including the reflected light amount detected from the workpiece; and learning the light output command data containing the light output command to the laser power supply unit by associating the light output command data with the state data of the laser apparatus and the result of the light output command data including the reflected light amount.

These and other objects, features, and advantages of the present invention will become more apparent from the detailed description of typical embodiments as set forth below with reference to the accompanying drawings.

DETAILED DESCRIPTION

Figure 1:
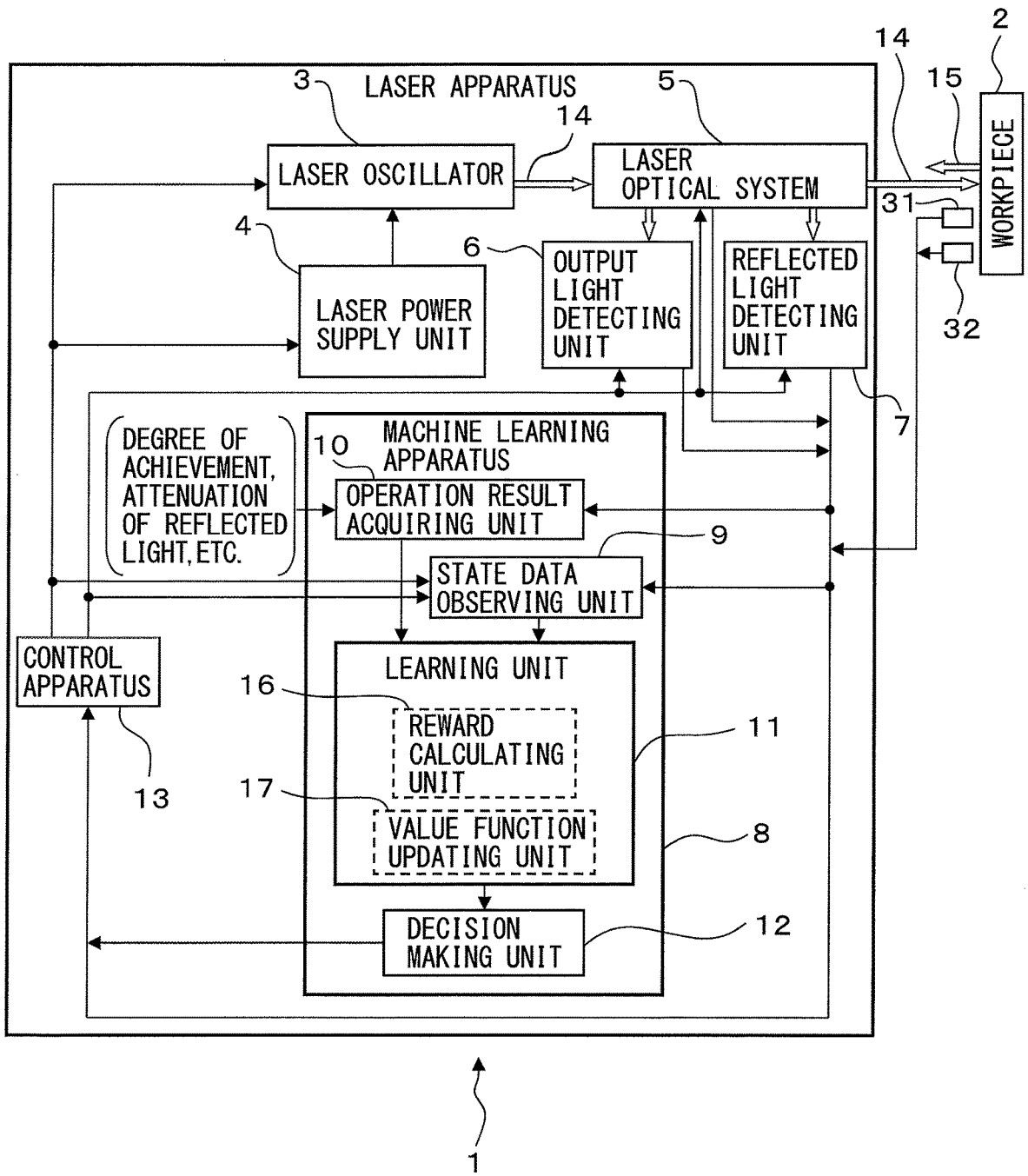
FIG. 1 is a block diagram showing in conceptual form the configuration of a laser apparatus according to one embodiment of the present invention.

Embodiments of the present invention will be described below with reference to the accompanying drawings. Throughout the drawings, like component members are designated by like reference numerals. Further, for ease of understanding, the drawings are not necessarily drawn to scale.

FIG. 1 is a block diagram showing in conceptual form the configuration of a laser apparatus 1 according to one embodiment of the present invention. The laser apparatus 1 according to the present embodiment is a laser apparatus 1 for performing machining such as cutting or welding by applying laser beam 14 to a workpiece 2, and comprises: at least one laser oscillator 3; at least one or more laser power supply units 4 for supplying power to the laser oscillator 3; a laser optical system 5; an output light detecting unit 6 for measuring an output light amount which is the amount of the laser beam 14 output from the laser oscillator 3 by passing through the laser optical system 5; a reflected light detecting unit 7 for measuring a reflected light amount which is the amount of reflected light 15, the reflected light 15 being the laser beam 14 reflected from a surface of the workpiece 2 back into the laser oscillator 3 and/or the laser optical system 5; a control apparatus 13 which controls the laser oscillator 3, the laser power supply unit 4, the laser optical system 5, the output light detecting unit 6, and the reflected light detecting unit 7 independently of each other; and a machine learning apparatus 8.

The machine learning apparatus 8 comprises a state data observing unit 9, an operation result acquiring unit 10, a learning unit 11, and a decision making unit 12. The machine learning apparatus 8 learns and outputs light output command data which contains a light output command to be issued to the laser power supply unit 4.

The laser oscillator 3 is, for example, a direct-diode laser oscillator that uses a laser diode module as a laser light source, or a fiber laser oscillator that uses a laser diode module as a pump light source. The laser power supply unit 4 that supplies power to the laser diode module in such a laser oscillator 3 is controlled by the control apparatus 13. The laser beam 14 output from the laser oscillator 3 is applied to the workpiece 2 by passing through the laser optical system 5, and is used to perform a machining operation such as cutting or welding on the workpiece 2.

Basic information of the laser apparatus 1, which defines basic characteristics such as the range of the output light amount that the laser apparatus 1 is capable of outputting and the relationship between the output light amount and the voltage and power supplied from the laser power supply unit 4 to the laser oscillator 3, may be loaded in advance into the state data observing unit 9 from the control apparatus 13.

The laser beam 14 applied to the workpiece 2 is reflected from the surface of the workpiece 2 and reenters the laser oscillator 3 and/or the laser optical system 5; if the amount of the reentering reflected light 15 (returned light) is large, the laser oscillator 3 and/or the laser optical system 5 may become damaged. It is therefore desirable that, upon detecting that the reflected light amount obtained from the output data of the reflected light detecting unit 7 has reached a first predetermined level, a command for temporarily shutting off or reducing the laser beam output be issued to the laser power supply unit 4 to shut off or reduce the output of the laser beam 14 even when the laser power supply unit 4 is in the process of executing the light output command. However, it is desirable that the decision making unit 12 re-output light output command data containing a new next light output command to the laser power supply unit 4 so that the machining can be started.

Further, it is desirable that the first predetermined level for the reflected light amount be set lower than the second predetermined level which is set lower than an alarm level corresponding to a light amount above which the reflected light amount is highly likely to damage the laser oscillator 3 and/or the laser optical system 5. This serves to reliably prevent damage from being caused to the laser oscillator 3 and/or the laser optical system 5.

It is also desirable that the decision making unit 12 output the light output command data by determining the light output command data substantially in succession in a time series manner, at least during the predefined time period, until succeeding in starting the machining.

Starting the machining means starting the primarily intended machining operation such as cutting or welding, and the formation of tiny pits or holes to be performed before performing the machining operation and therefore not included in the primarily intended machining operation does not fall into the category of the machining to be started here.

When the decision making unit 12 is configured to output the light output command data by determining the light output command data substantially in succession in a time series manner, at least during the predefined time period, until succeeding in starting the machining, not only does the probability of succeeding in starting the machining increase, but the time loss can also be reduced, as the light output command data is output in succession even after failing to start the machining with single-shot light output command data corresponding to a trial shot.

Since the light output command data is output in succession, it follows that when determining the light output command data, there exists previous light output command data output before that light output command data; therefore, in this case, it is desirable that the output data of the reflected light detecting unit 7 obtained for the laser beam 14 output based on the previous light output command data be utilized in determining the light output command data. By utilizing the output data of the reflected light detecting unit 7 obtained for the laser beam 14 output based on the previous light output command data, it becomes possible to output more appropriate light output command data. If, with the previous light output command data, the reflected light amount has reached the first predetermined level, the result can also be fed back to output the next light output command data, which serves to reduce the probability of outputting the light output command data such that the reflected light amount again reaches the first predetermined level.

FIGS. 2 to 7 schematically illustrate specific examples of how the output light amount and the reflected light amount of the laser beam 14 output in response to the light output command issued to the laser power supply unit 4 change over time. It will be noted that the ordinate is plotted on an arbitrary scale constructed by applying modifications such as increasing the magnification ratio for the reflected light amount for ease of viewing and is not intended to represent absolute values.

Figure 2:
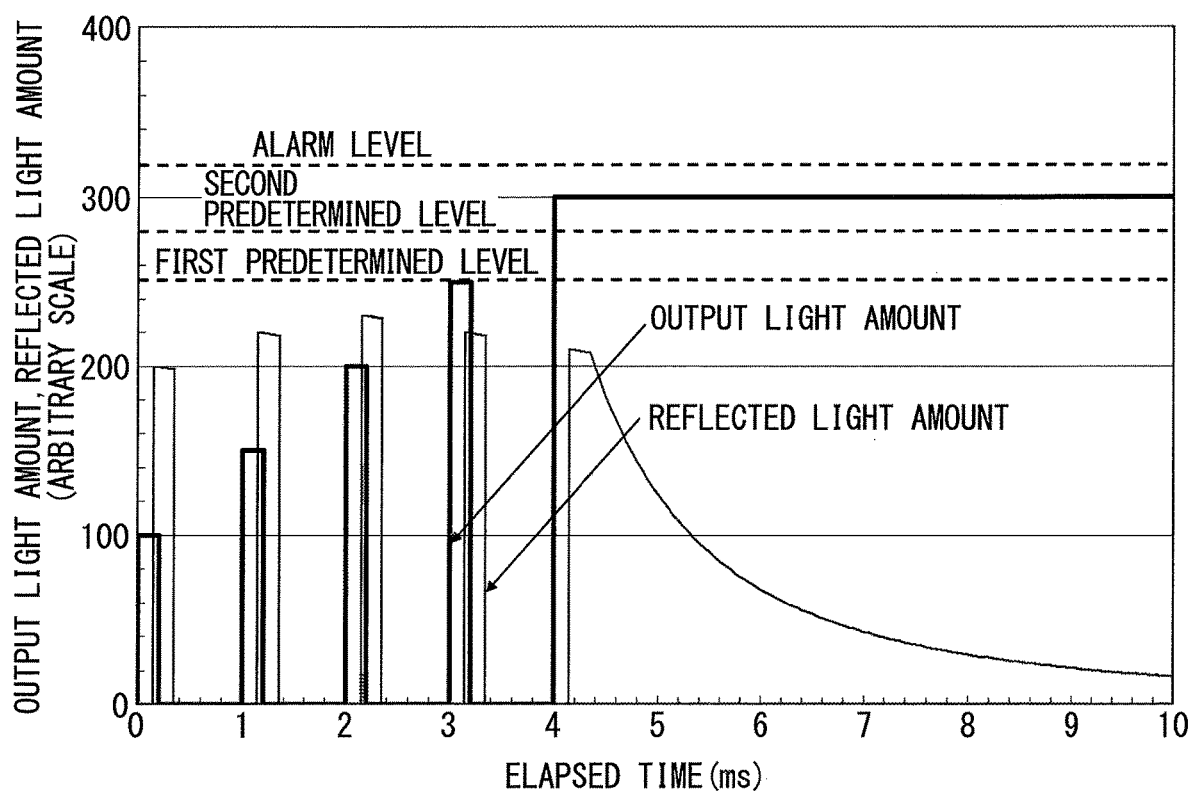
FIG. 2 is a diagram schematically illustrating how the output light amount and the reflected light amount of the laser beam output in response to a light output command issued to a laser power supply unit change over time.
Figure 3:
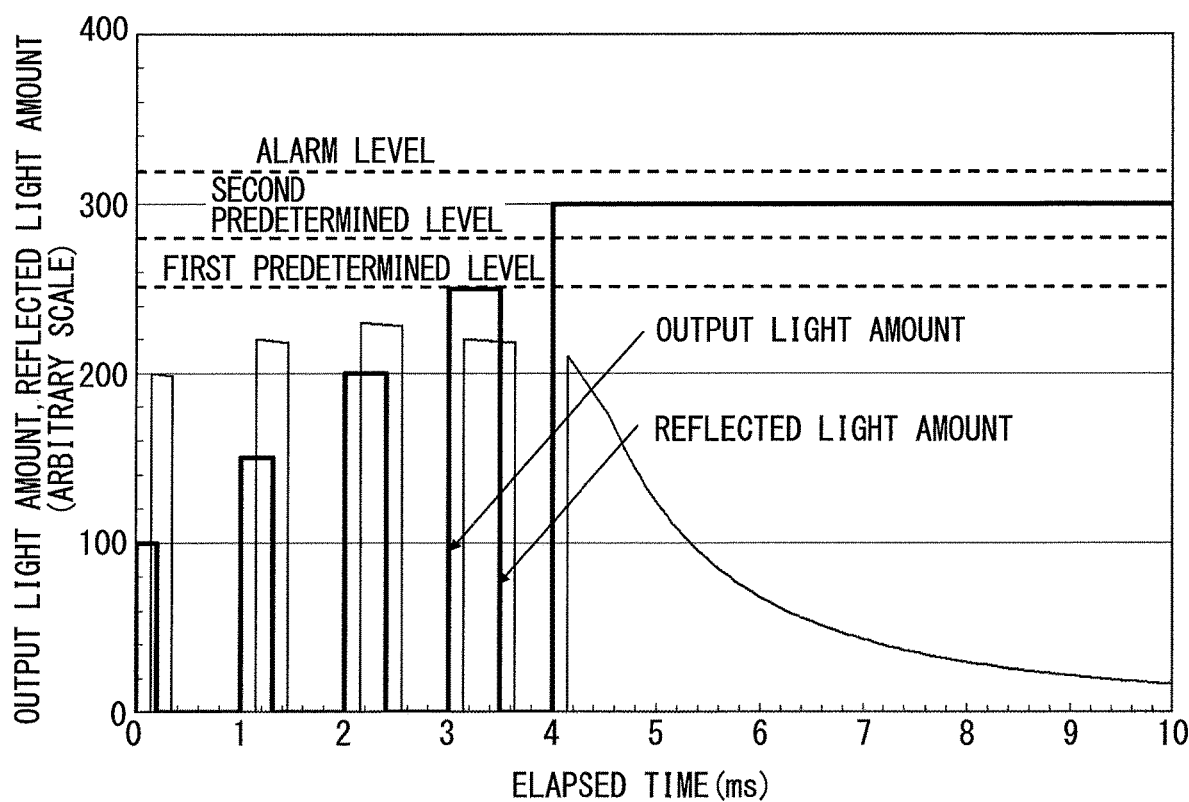
FIG. 3 is a diagram schematically illustrating how the output light amount and the reflected light amount of the laser beam output in response to the light output command issued to the laser power supply unit change over time.

In FIG. 2, the reflected light 15 (reflected light amount) is detected with some delay relative to the pulse laser beam output (output light amount). This illustrates the time required for signal processing, etc., but this is only illustrative and, depending on the time scale, there are cases where virtually no time delay occurs. Further, the pulse width, the pulse spacing, and the variation of the peak output of the pulse laser beam 14 shown in FIG. 2 are also only illustrative and not restrictive, and the pulse width, pulse spacing, time axis, etc., that are totally different from those shown in FIG. 2 are also possible. Furthermore, the pulse width and the pulse spacing may be varied as shown in FIG. 3. Usually, it is desirable that the peak output be set higher as the reflected light amount decreases, but alternatively the peak output may be set constant.

Figure 4:
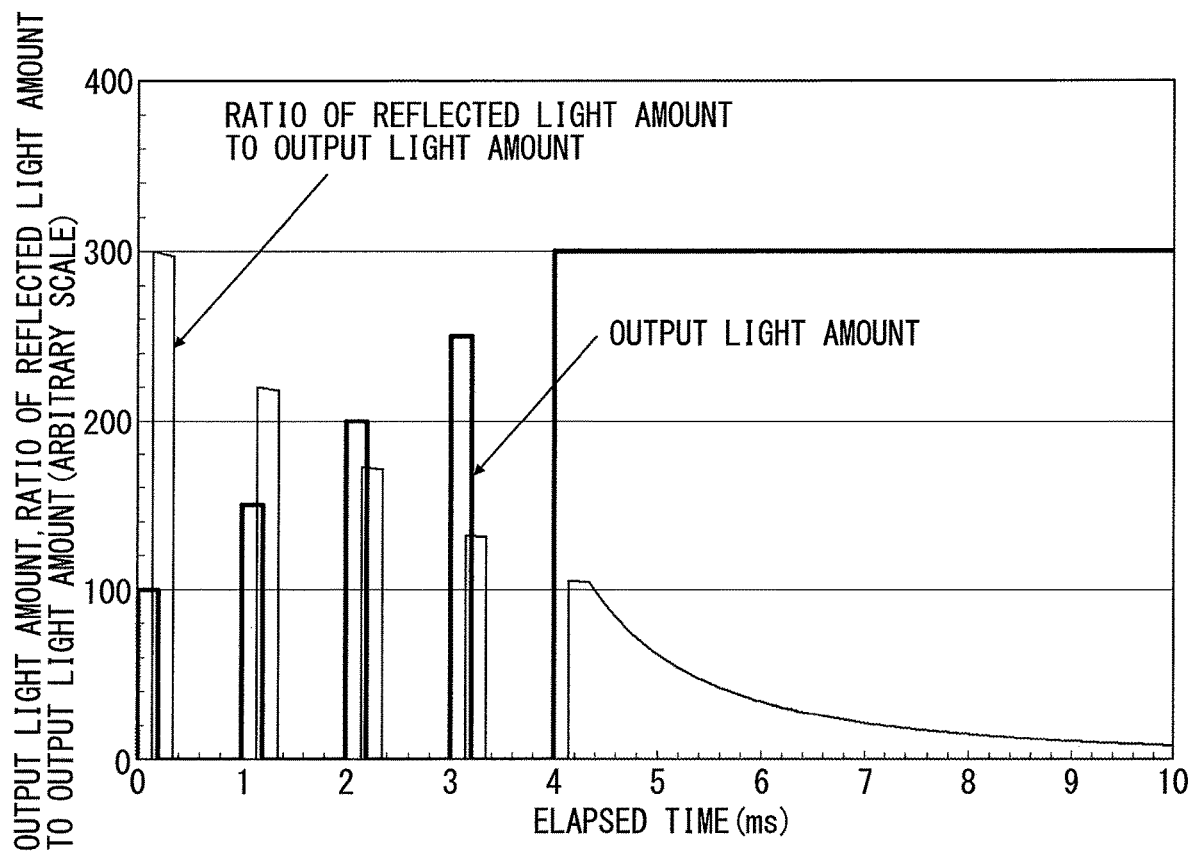
FIG. 4 is a diagram schematically illustrating how the output light amount and the reflected light amount of the laser beam output in response to the light output command issued to the laser power supply unit change over time.

In the example of FIG. 2, as the surface state of the workpiece 2 changes due to the application of the pulse laser beam 14, the reflectance ($\propto$ the ratio of the reflected light amount to the output light amount) decreases, and the peak output of the pulse laser beam is gradually raised, but since the output light amount has reached the level (in the illustrated example, 300) required for the intended machining without the reflected light amount increasing up to the first predetermined level (in the illustrated example, 250), the machining is started by fixing the output light amount to the level required for the intended machining. In FIG. 4, the ratio of the reflected light amount to the output light amount is plotted for the case of FIG. 2. As shown, the reflectance decreases as the surface state of the workpiece 2 changes due to the application of the pulse laser beam, and in order to enable the machining to be started in a short time, the rate of decrease or the speed of decrease of the ratio of the reflected light amount to the output light amount must be increased, and the laser beam 14 of a high output effective in changing the surface state of the workpiece 2 must be applied within a range that does not cause the reflected light amount to exceed the first predetermined level.

The light output command data for commanding the output of the pulse laser beam may be output as light output command data for commanding the output of a single pulse, or may be output as light output command data for commanding, in a single operation, a plurality of pulse laser beam outputs such as shown in FIG. 2.

Figure 5:
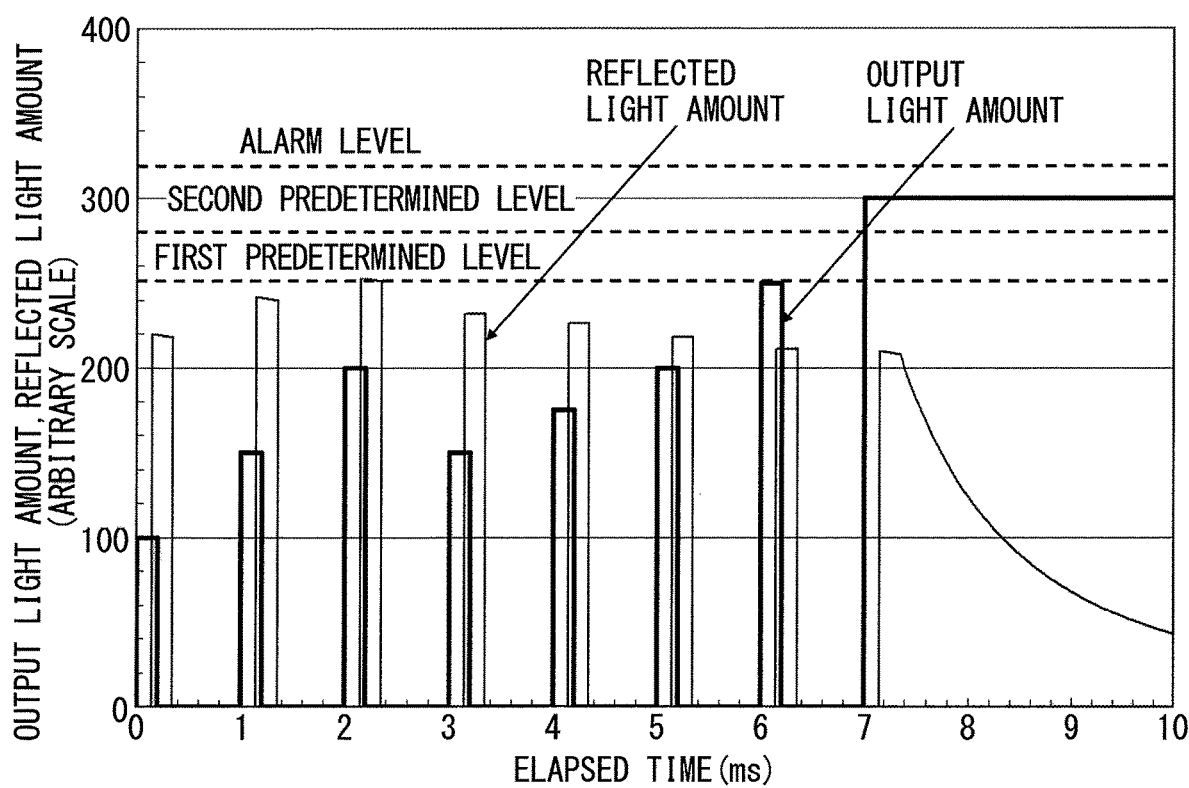
FIG. 5 is a diagram schematically illustrating how the output light amount and the reflected light amount of the laser beam output in response to the light output command issued to the laser power supply unit change over time.

FIG. 5 illustrates an example of how the output light amount and the reflected light amount change over time after the reflected light amount has reached the first predetermined level. In this example, since the reflected light amount for the third pulse light has reached the first predetermined level, the laser output is temporarily reduced, and information indicating that the reflected light amount has reached the first predetermined level is fed back (learned), based on which the next light output command data is output. Compared with the case of FIG. 2, the time required to start the machining increases.

Figure 6:
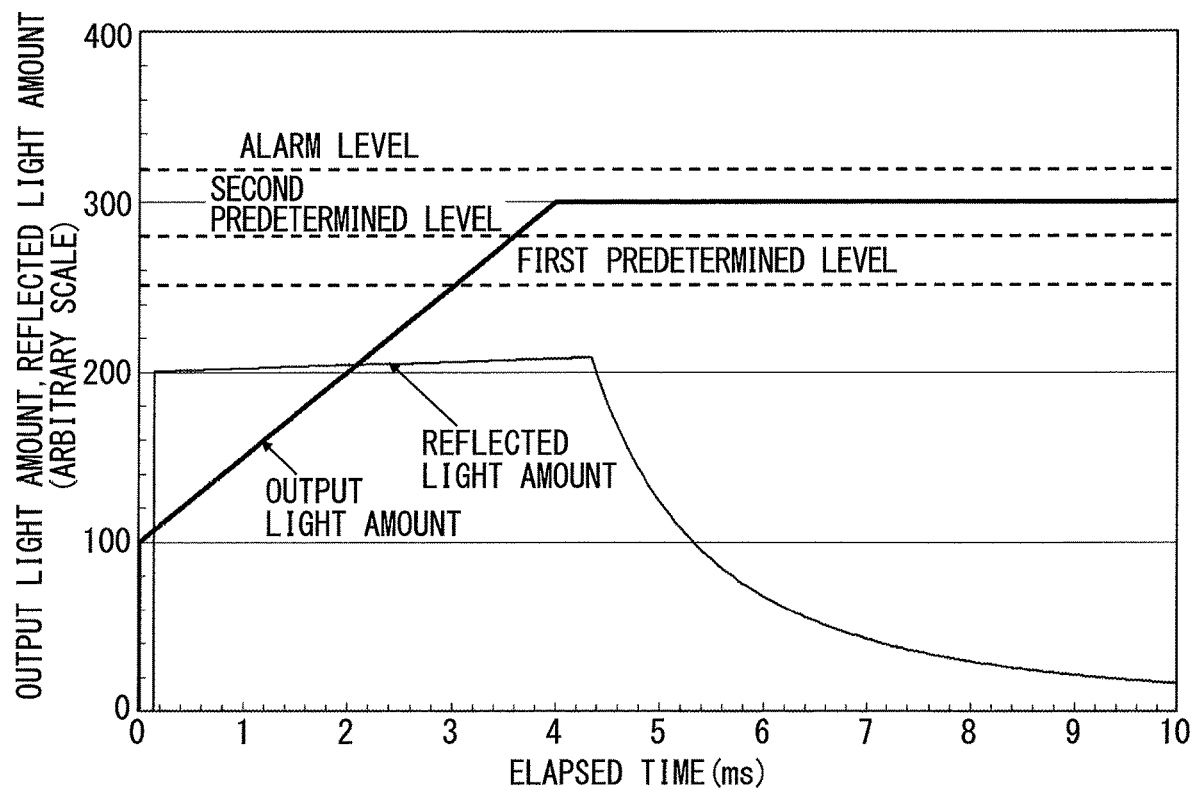
FIG. 6 is a diagram schematically illustrating how the output light amount and the reflected light amount of the laser beam output in response to the light output command issued to the laser power supply unit change over time.
Figure 7:
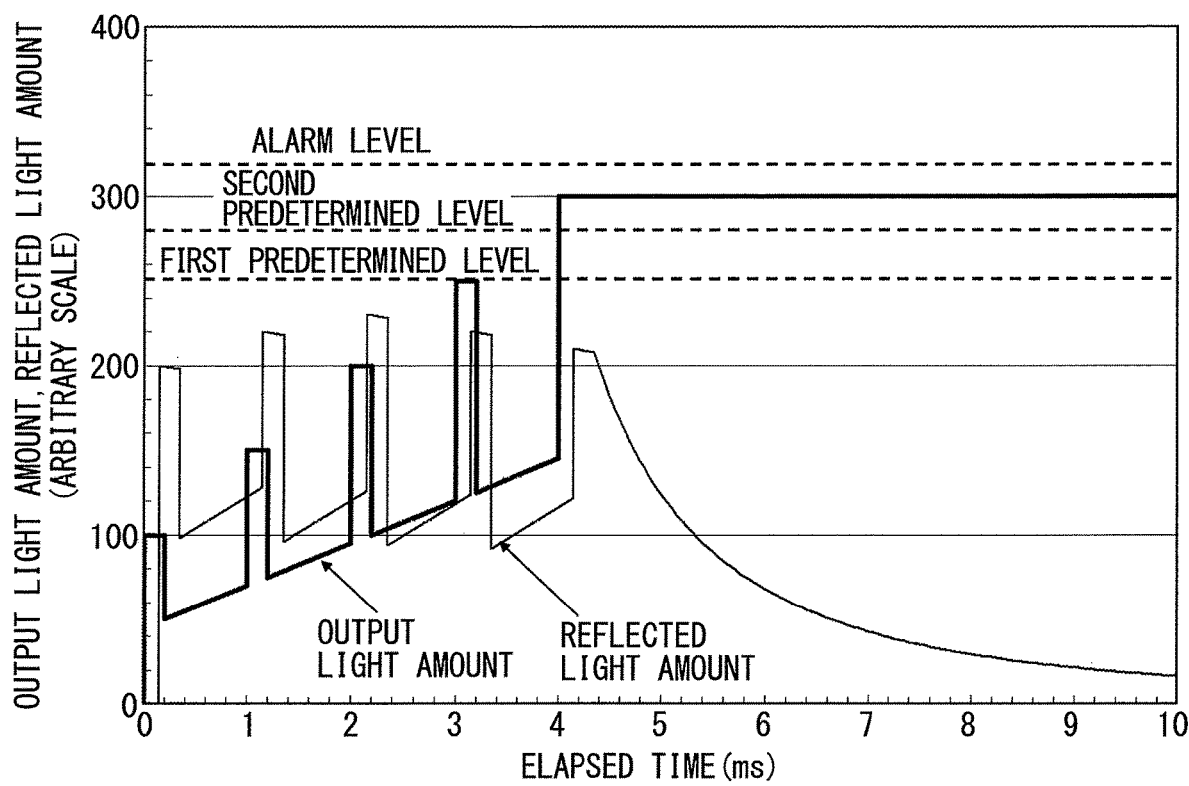
FIG. 7 is a diagram schematically illustrating how the output light amount and the reflected light amount of the laser beam output in response to the light output command issued to the laser power supply unit change over time.

The laser beam 14 to be output before starting the machining in order to start the machining need not be limited to pulsed light. For example, continuously varying laser beam 14 such as shown in FIG. 6 or an output waveform produced by superimposing pulse laser beam on the continuously varying laser beam 14, such as shown in FIG. 7, may be used. Of course, the output light amount may be set constant so as not to vary for a certain period of time. The only requirement is that the light output command data that enables the machining to be started in a short time be learned and output, and the output waveform, etc., need not be limited to the output waveform, etc., illustrated in FIGS. 2 to 7.

In FIG. 1, open arrows schematically indicate light beams of the laser beam 14 and the reflected light 15, but the light beams schematically indicated here are not limited to those propagating through space, but also include, for example, those propagating through optical fiber. The same applies for the laser beam 14 output from the laser apparatus 1, and the laser beam 14 is schematically indicated by also considering the inclusion of a structure in which a machining head is provided at the end of optical fiber, the machining head being constructed so that the laser beam 14 propagated through the optical fiber is substantially focused on the surface of the workpiece 2. While the laser beam 14 applied to the workpiece 2 and the reflected light 15 from the workpiece 2 are shown with their optical axes displaced from each other for ease of viewing, it will be appreciated that when the laser beam 14 is incident substantially normal to the surface of the workpiece 2, the optical axes substantially coincide with each other, the direction of the light beam being simply reversed on reflection.

Further, while the laser optical system 5 is illustrated as being wholly contained within the laser apparatus, the laser optical system 5 is schematically illustrated by also including the optics of the machining head provided at the end of the optical fiber extended outwardly from the laser apparatus 1, and the laser optical system 5 is used so that the laser beam 14 output from the laser apparatus 1 is substantially focused, for example, on the surface of the workpiece 2. It is desirable that the laser optical system 5 be configured to be able to be controlled by the control apparatus 13.

While it is schematically illustrated that the light is incident on the output light detecting unit 6 and the reflected light detecting unit 7 from the laser optical system 5, the structure of making the light incident on the output light detecting unit 6 and the reflected light detecting unit 7 is not limited to the illustrated structure; for example, when the light is propagating through space, a portion of the light may be separated using, for example, a half-silvered mirror and the separated portion of the light may be detected, and when the light is propagating through optical fiber, the light emerging from the end of the optical fiber and separated using, for example, an optical divider may be detected, or the light leaking through the clad of the optical fiber may be detected.

In FIG. 1, only one laser oscillator 3 and one laser power supply unit 4 are shown, but the laser apparatus 1 may include a plurality of laser oscillators 3 for such purposes as increasing the output power. The laser beam 14 from the plurality of laser oscillators 3 may be combined using a beam combiner. In that case, independently controllable laser power supply units 4 may be provided, one for each laser oscillator 3.

Further, in FIG. 1, the outputs from the output light detecting unit 6 and the reflected light detecting unit 7 or the laser optical system 5 are directly coupled to the state data observing unit 9 and the operation result acquiring unit 10, but a preprocessing unit which performs preprocessing such as calculating the reflectance of the surface of the workpiece 2 from the output data of the output light detecting unit 6 and the output data of the reflected light detecting unit 7, for example, may be provided, and the outputs may first be fed to the preprocessing unit and then input to the state data observing unit 9 and the operation result acquiring unit 10.

The machine learning apparatus 8, which comprises the operation result acquiring unit 10, the state data observing unit 9, the learning unit 11, and the decision making unit 12, has the function of extracting useful rules, knowledge representation, criteria, etc., through analysis from a set of data input to the machine learning apparatus 8 and outputting the result of the judgment while learning the knowledge (machine learning).

The operation result acquiring unit 10 can utilize the output data of the reflected light detecting unit 7. With the operation result acquiring unit 10 utilizing the output data of the reflected light detecting unit 7, the light output command data that enables the machining to be started under the condition that the reflected light amount does not reach the first predetermined level can be learned effectively in order to increase the reward.

It is desirable that the success/failure result of the machining start to be acquired by the operation result acquiring unit 10 be given in the form of a result indicating whether or not the light output command data that substantially coincides with the light output command data necessary or suitable for the machining of the workpiece 2 has been successfully output within the predefined time period. When the success/failure result of the machining start to be acquired by the operation result acquiring unit 10 is given in the form of the result indicating whether or not the light output command data that substantially coincides with the light output command data necessary or suitable for the machining of the workpiece 2 has been successfully output within the predefined time period, the learning can be performed that matches the purpose of the invention to start the machining within the predefined time period. After the light output command data has been output that substantially coincides with the light output command data necessary or suitable for the machining of the workpiece 2, that is, after the intended machining has been started successfully, it is desirable to hold the light output command data as the light output command data necessary or suitable for the machining of the workpiece 2. Accordingly, once the intended machining has been started successfully, the control apparatus 13 may control the laser oscillator 3, the laser power supply unit 4, the laser optical system 5, the output light detecting unit 6, and the reflected light detecting unit 7, not based on the light output command data supplied from the decision making unit 12, but based on the light output command data held in the control apparatus 13.

In the machine learning apparatus 8 illustrated in FIG. 1, the learning unit 11 includes a reward calculating unit 16 and a value function updating unit 17, and the reward calculating unit 16 calculates a reward, based on the results acquired by the operation result acquiring unit 10 which include the success or failure of the machining start, the time required to start the machining, the number of times that, or the frequency with which, the reflected light amount reached the predetermined level, and an amount corresponding to the time-integrated value of the amount by which the reflected light amount exceeded the first predetermined value; on the other hand, the value function updating unit 12 can update a value function that determines the value of the light output command data that the decision making unit outputs in response to the inputs from the state data observing unit 9 and the operation result acquiring unit 10.

When the machining has been started successfully within the predefined time period, the reward calculating unit 16 can increase the reward, with provisions made to increase the amount of increase of the reward as the time required to start the machining is shorter, and when the machining has failed to be started within the predefined time period, the reward calculating unit 16 can decrease the reward, with provisions made to increase the amount of decrease of the reward according to the number of times that, or the frequency with which, the reflected light amount reached the first predetermined level and to the amount corresponding to the time-integrated value of the amount by which the reflected light amount exceeded the first predetermined value.

There are various machine learning techniques. As earlier described, when outputting the light output command data in succession, the decision making unit 12 observes the state of the environment and determines the light output command data to be output, but the light output command data itself can cause a change in the environment, for example, the temperature of the workpiece 2 can rise due to the application of the laser beam 14 output based on the previous light output command data; accordingly, it is desirable to employ reinforcement learning, in which case a reward signal is fed back each time the light output command data is output, and the light output command data is learned with an aim to maximize the sum of the rewards to be obtained in the future.

Reinforcement learning is a method that learns not only judgment and classification but also an action and thereby learns the appropriate action based on the interaction between the action and the environment, that is, performs learning in order to maximize the reward to be obtained in the future. In the present embodiment, this means that an action that may affect the future can be acquired, the action being, for example, such that as a result of the output of the light output command data, the temperature of the workpiece 2 rises, facilitating the machining start.

The value function updating unit 17 can perform reinforcement learning using so-called Q-learning. However, the method of reinforcement learning is not limited to Q-learning. Q-learning is a method of learning a value Q (s, a) for selecting an action "a" under a given environment state "s"; that is, under a given environment state "s", an action "a" with the highest value Q (s, a) is selected as the optimal action.

However, since at first the correct value of Q(s, a) for the combination of the state "s" and the action "a" is not known, various actions "a" are selected under the given state "s", and a reward is presented for each selected action. In this way, the selection of the better action, and hence the correct value Q(s, a), is learned.

Further, since it is desired to maximize the sum of the rewards to be obtained in the future as a result of the action, the final goal is to achieve Q(s, a)=E[Σ(γ$^t$)r$_t$]. Here, E[ ] represents the expected value, t represents the time, γ is a parameter called the discount factor to be described later, r$_t$ is the reward at time t, and Σ represents the sum at time t. In this equation, the expected value is taken with respect to the state change expected to occur when the optimal action is taken, but since the optimal action is not known yet, it must be learned by searching. The update equation for such a value Q(s, a) is given, for example, by the following equation (1).

In other words, the value function updating unit 17 updates the value function Q(s$_t$, a$_t$) by using the following equation (1).

$$Q(s_t, a_t) \leftarrow Q(s_t, a_t) + \alpha\left(r_{t+1} + \gamma\max_a Q(s_{t+1}, a) - Q(s_t, a_t)\right) \quad (1)$$

where s$_t$ denotes the environment state at time t, and a$_t$ the action at time t. With the action a$_t$, the state changes to s$_{t+1}$. Then, r$_{t+1}$ represents the reward that is given as a result of that state change. The term with max is given by multiplying the Q value of the action "a" by γ when the action "a" with the Q value known to be highest at that time was selected under the state s$_{t+1}$. Here, γ is a parameter within the range of 0<γ≤1, and is called the discount factor. On the other hand, α is the learning coefficient, which is set within the range of 0<α≤1.

The above equation (1) shows how the evaluation value Q(s$_t$, a$_t$) of the action a$_t$ under the state s$_t$ is updated based on the reward r$_{t+1}$ returned as a result of the trial a$_t$. That is, the equation shows that if the sum of the reward r$_{t+1}$ and the evaluation value Q (s$_{t+1}$, max a$_{t+1}$) of the best action "max a" under the next state determined by the action "a" is larger than the evaluation value Q(s$_t$, a$_t$) of the action "a" under the state "s", then Q(s$_t$, a$_t$) is increased, and conversely, if it is smaller, Q(s$_t$, a$_t$) is reduced. That is, the value of a given action under a given state is brought closer to the value of the best action in the next state determined by that given action and the reward immediately returned as a result of the action.

There are two methods of expressing Q(s, a) on a computer: in one method, the values for all of the state/action pairs (s, a) are stored in the form of an action value table, and in the other, a function for approximating Q(s, a) is presented. In the latter method, the above equation (1) can be realized by adjusting the parameters of the approximation function using, for example, a probability gradient descent method or the like. A neural network can be used as the approximation function. The neural network is constructed, for example, using a computing device, memory, etc., mimicking a neuron model.

Figure 8:
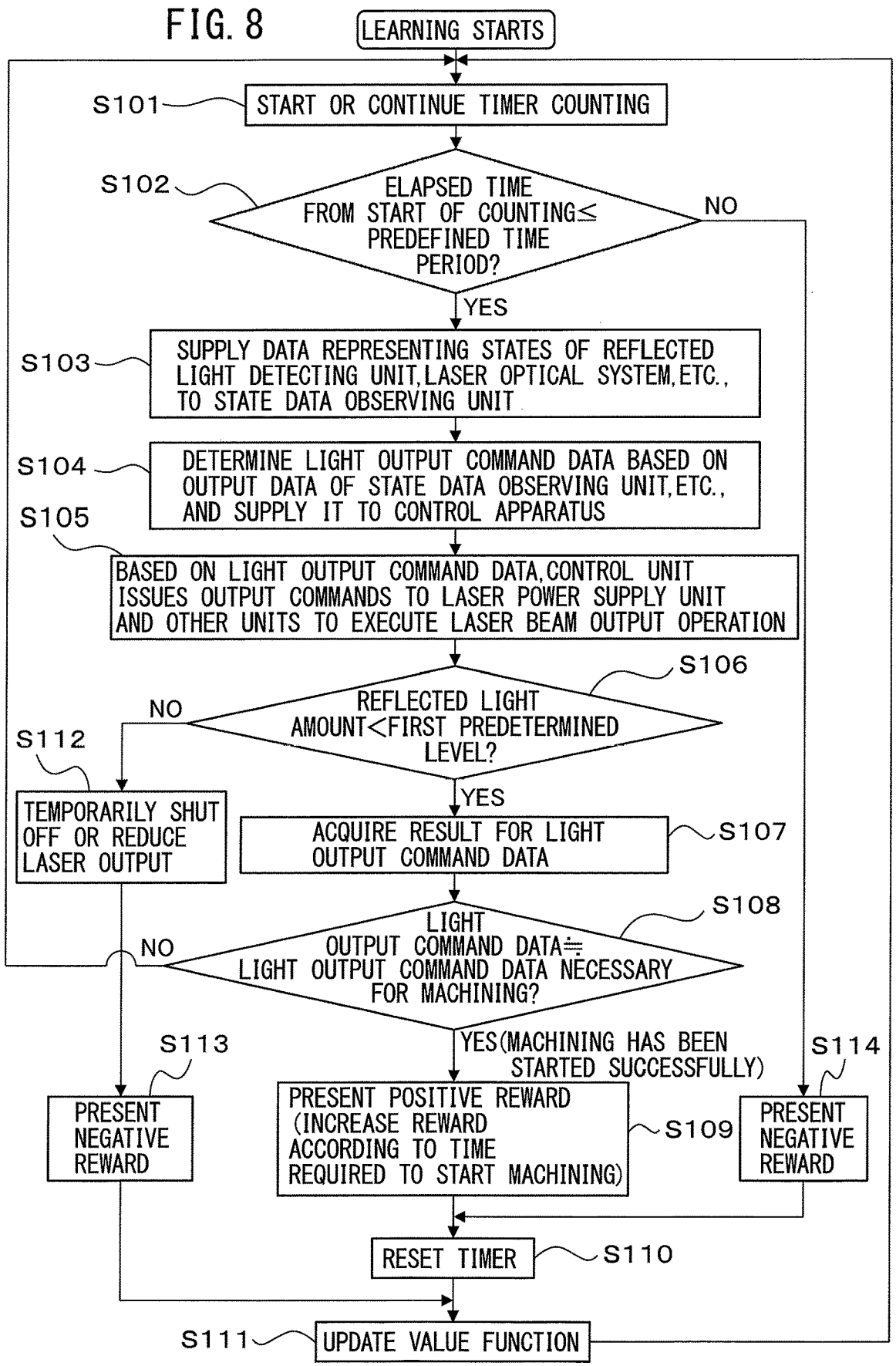
FIG. 8 is a flowchart illustrating one operational example of a machine learning apparatus shown in FIG. 1.

Then, one operational example of the machine learning apparatus 8 incorporated in the laser apparatus 1 of the present embodiment will be described. FIG. 8 is a flowchart illustrating one operational example of the machine learning apparatus 8 shown in FIG. 1. As illustrated in FIG. 8, when the learning action (learning process) is started in the machine learning apparatus 8 shown in FIG. 1, the timer starts counting (step S101). Next, it is determined whether the time elapsed from the start of the counting has exceeded the predefined time period (step S102); if the predefined time period is not exceeded, data representing the states of the reflected light detecting unit 7, the laser optical system, etc., is supplied to the state data observing unit 9 (step S103), and the light output command data is determined based on the learning results so far obtained, the output data of the state data observing unit 9, etc., and the light output command data, which contains a light output command to the laser supply unit 4, is supplied to the control apparatus 13 (step S104). Next, based on the light output command data, the control unit 13 issues output commands to the laser power supply unit and other units to execute the laser beam output operation (step S105). While the laser beam output is being executed based on the light output command data, the reflected light amount is constantly detected (step S106), and upon detecting that the reflected light amount has reached the first predetermined level, the laser output is temporarily shut off or reduced (step S112); on the other hand, if the reflected light amount is less than the first predetermined level, the laser output being executed based on the light output command data is completed through to the end, and the result for the light output command data is acquired (step S107). The result for the light output command data is evaluated (step S108), and if the light output command data does not reach the level that substantially coincides with the light output command data necessary or suitable for the intended machining, that is, if the level of the machining capability achieved by the light output command data does not reach the level of the machining capability necessary or suitable for the intended machining, the process returns to step S101 to repeat the flow from step S101 onward. On the other hand, if the light output command data reaches the level that substantially coincides with the light output command data necessary or suitable for the intended machining, that is, if the level of the machining capability achieved by the light output command data reaches the level of the machining capability necessary or suitable for the intended machining, then it is determined that the machining can be started, that is, the machining has been started successfully, and a positive reward is presented (step S109). The positive reward may be increased according to the time elapsed from the start of the timer counting, i.e., the time required to start the machining. That is, it is preferable to increase the positive reward as the time required to start the machining is shorter, thus providing an incentive to learn to shorten the time required to start the machining. Since the machining has been started successfully, the timer is reset (step S110), the value function or the action value table is updated (step S111), and the process waits until the next machining is started.

If it is determined in step S102 that the time elapsed from the start of the counting has exceeded the predefined time period, it is determined that the machining has failed to be started within the predefined time period; therefore, a negative reward is presented (step S114), the timer is reset (step S110), the value function is updated (step S111), and the process waits for the next command. Alternatively, the process may be caused to return to step S101 to repeat the flow from step S101 onward.

Likewise, when it is determined in step S106 that the reflected light amount has reached the first predetermined level, and thereupon, the laser output is temporarily shut off or reduced (step S112), a negative reward is presented (step S113), the value function is updated (step S111), and the process returns to step S101 to repeat the flow from step S101 onward.

By repeating the above steps S101 to S114, the learning unit 11 performs learning by repeatedly updating the value function or the action value table.

Usually, the learning by the above-described reinforcement learning starts from the state in which there is no knowledge or incomplete knowledge of the result that would be caused by the action, but alternatively the learning may be started by setting as the initial state the state acquired by performing pre-learning by supervised learning or the like, i.e., the state after a certain amount of learned knowledge has been accumulated. Supervised learning is a method of learning in which the machine learning apparatus 8 is presented with a large number of data sets, each comprising a given input and a result (label), and learns features contained in the data sets, thereby acquiring inductively a model for estimating the result from the input, that is, the relationship between them.

Figure 9:
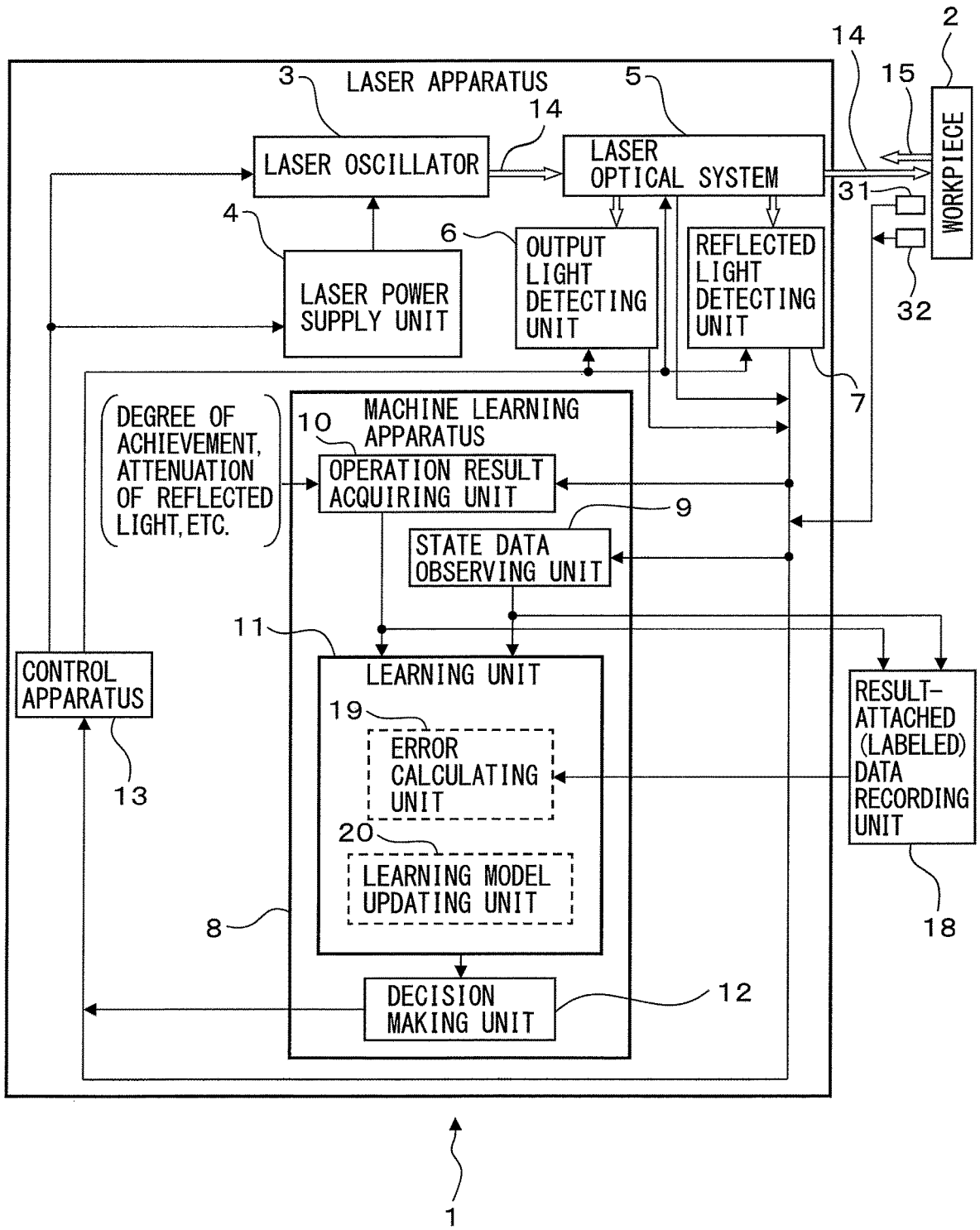
FIG. 9 is a block diagram showing in conceptual form the configuration of a laser apparatus according to another embodiment of the present invention.

FIG. 9 is a block diagram showing in conceptual form the configuration of a laser apparatus 1 according to another embodiment of the present invention; more specifically, a laser apparatus 1 to which supervised learning is applied is shown here. As is apparent from a comparison between FIG. 9 and the earlier presented FIG. 1, the laser apparatus 1 of FIG. 9 to which supervised learning is applied differs from the laser apparatus 1 of FIG. 1 to which Q-learning (reinforcement learning) is applied, by the inclusion of a result-attached (labeled) data recording unit.

As shown in FIG. 9, the machine learning apparatus 8 incorporated in the laser apparatus 1 to which supervised learning is applied comprises a state data observing unit 9, an operation result acquiring unit 10, a learning unit 11, and a decision making unit 12. The learning unit 11 includes an error calculating unit 19 and a learning model updating unit 20. In the laser apparatus 1 of this embodiment also, the machine learning apparatus 8 learns and outputs light output command data which contains a light output command to be issued to the laser power supply unit 4.

An error between the result (label) output from the operation result acquiring unit 10 and the output of the learning model mounted in the learning unit 11 is calculated by the error calculating unit 19. The result-attached (labeled) data recording unit 18, which holds the previously obtained result-attached (labeled) data, can present the result-attached (labeled) data to the error calculating unit 19. Alternatively, the result-attached (labeled) data of the laser apparatus 1 may be presented to the error calculating unit 19 in the laser apparatus 1 via such means as a memory card or a communication channel.

When the result including the reflected light amount for the light output command data, for example, the reciprocal of the rate of decrease of the ratio of the reflected light amount to the output light amount and/or the reciprocal of the speed of decrease of the ratio of the reflected light amount to the output light amount, is defined as the error, and when the rate of decrease of the ratio of the reflected light amount to the output light amount or the speed of decrease of the ratio of the reflected light amount to the output light amount is smaller than a predetermined value (including the case where the rate of decrease or speed of decrease is negative in value, that is, the ratio of the reflected light amount to the output light amount increases, though usually this may not be often the case) or when the reflected light amount has exceeded the first predetermined value, it is determined that a finite error of a certain magnitude has occurred; then, by performing supervised learning so as to bring the error closer to zero, it becomes possible to learn the light output command data that maximizes the rate of decrease of the ratio of the reflected light amount to the output light amount and/or the speed of decrease of the ratio of the reflected light amount to the output light amount, which is fundamental but of utmost importance, that is, the light output command data that is effective in reducing the reflectance (cc the ratio of the reflected light amount to the output light amount) and that does not cause the reflected light amount to exceed the second predetermined level. Then, using the result of the learning, it also becomes possible to perform further advanced learning so that the light output command data suitable for increasing the light output up to the level that can start the machining in a short time can be output while satisfying the condition that the reflected light amount does not exceed the second predetermined level, which is the final goal.

Since the purpose of starting the machining while satisfying the condition that the reflected light amount does not exceed the second predetermined level can be achieved to a satisfactory level with the supervised learning alone, reinforcement learning is not necessarily an essential requirement.

In one learning example of a machine learning device that performs supervised learning, a regression equation is set as a prediction model, for example, as shown by the following equation (2), and the learning is performed by adjusting the values of the coefficients a0, a1, a2, a3, . . . so that the value of the dependent variable y can be obtained when the values that the respective state variables x1, x2, x3, . . . take in the process of learning are applied to the regression equation. The method of learning is not limited to this particular one, but differs for each supervised learning algorithm.

$$y = a_0 + a_1 x_1 + a_2 x_2 + a_3 x_3 + \ldots + a_n x_n \quad (2)$$

Various supervised learning algorithms, such as a neural network, a least squares method, etc., are known, and any of these supervised learning algorithms may be employed as the method to be applied to the present invention.

Figure 10:
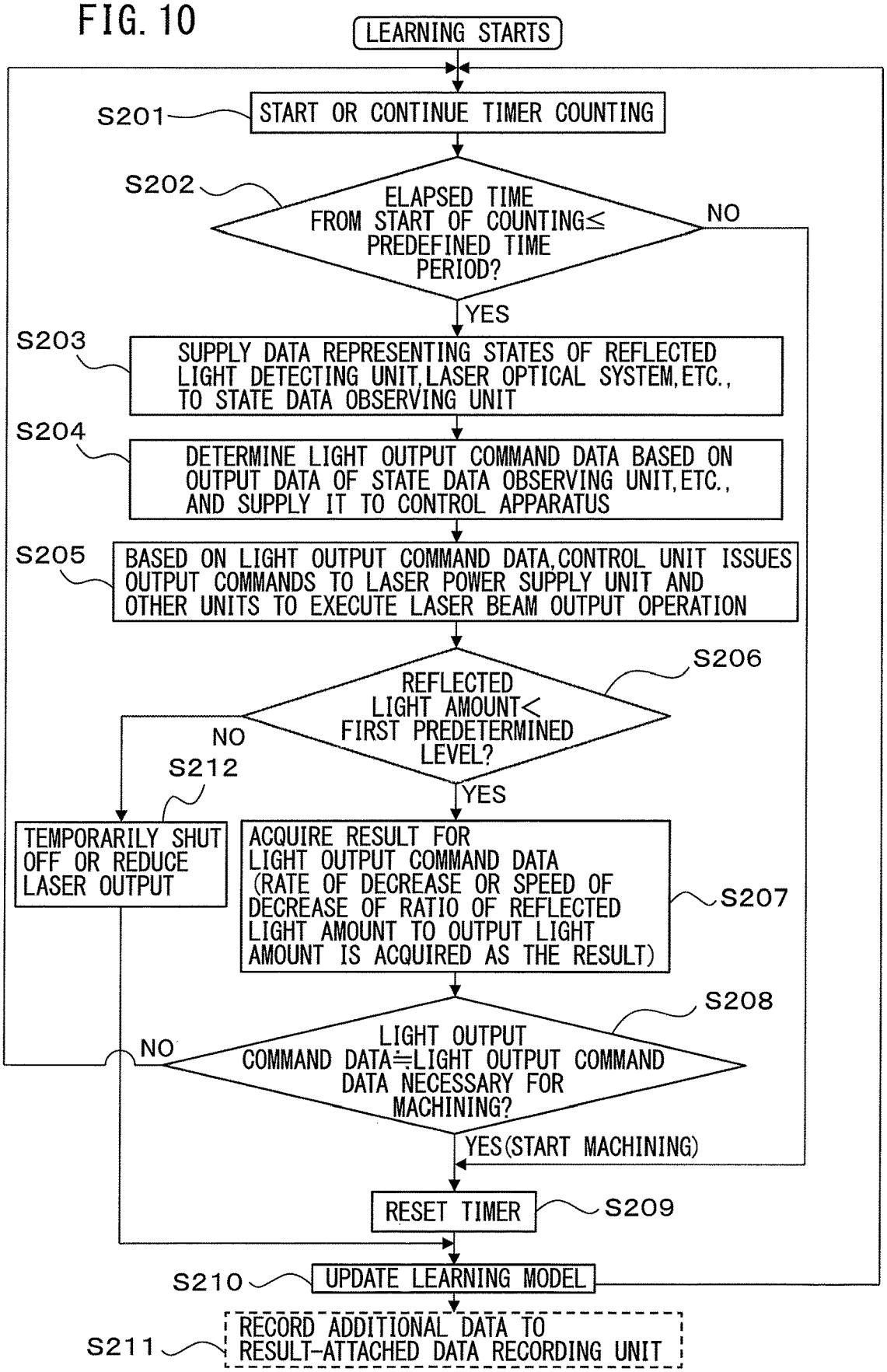
FIG. 10 is a flowchart illustrating one, operational example of a machine learning apparatus shown in FIG. 9.

FIG. 10 is a flowchart illustrating one operational example of the machine learning apparatus 8 shown in FIG. 9. As illustrated in FIG. 10, when the learning action (learning process) is started in the machine learning apparatus 8 shown in FIG. 9, the timer starts counting (step S201). Next, it is determined whether the time elapsed from the start of the counting has exceeded the predefined time period (step S202); if the predefined time period is not exceeded, data representing the states of the reflected light detecting unit 7, the laser optical system, etc., is supplied to the state data observing unit 9 (step S203), and the light output command data is determined based on the learning results so far obtained, the output data of the state data observing unit 9, etc., and the light output command data, which contains a light output command to the laser supply unit 4, is supplied to the control apparatus 13 (step S204). Next, based on the light output command data, the control unit 13 issues output commands to the laser power supply unit and other units to execute the laser beam output operation (step S205). While the laser beam output is being executed based on the light output command data, the reflected light amount is constantly detected (step S206), and upon detecting that the reflected light amount has reached the first predetermined level, the laser output is temporarily shut off or reduced (step S212); on the other hand, if the reflected light amount is less than the first predetermined level, the laser output being executed based on the light output command data is completed through to the end, and the result for the light output command data is acquired (step S207). The rate of decrease or speed of decrease of the ratio of the reflected light amount to the output light amount ($\propto$ reflectance), for example, can be acquired as the result for the light output command data. In this case, the reciprocal of the rate of decrease or speed of decrease of the ratio of the reflected light amount to the output light amount is defined as the error, and supervised learning can be performed so as to bring the error closer to zero. In this case, it is preferable that when the rate of decrease or speed of decrease of the ratio of the reflected light amount to the output light amount is smaller than a predetermined value (including the case where the rate of decrease or speed of decrease is negative in value, that is, the ratio of the reflected light amount to the output light amount increases, though usually this may not be often the case), it is determined that a finite error of a certain magnitude has occurred.

Then, the result for the light output command data is evaluated (step S208), and if the light output command data does not reach the level that substantially coincides with the light output command data necessary or suitable for the intended machining, that is, if the level of the machining capability achieved by the light output command data does not reach the level of the machining capability necessary or suitable for the intended machining, the process returns to step S201 to repeat the flow from step S201 onward. On the other hand, if the light output command data reaches the level that substantially coincides with the light output command data necessary or suitable for the intended machining, that is, if the level of the machining capability achieved by the light output command data reaches the level of the machining capability necessary or suitable for the intended machining, the machining can be started; therefore, the machining is started, the timer is reset (step S209), the learning model is updated (step S210), result-attached (labeled) data, if any, is additionally recorded to the result-attached (labeled) data recording unit 18 (step S211), and the process waits until the next machining is started.

If it is determined in step S202 that the time elapsed from the start of the counting has exceeded the predefined time period, the timer is reset (step S209), and the updating of the learning model (step S210) and the additional recording of the result-attached (labeled) data to the result-attached (labeled) data recording unit 18 (step S11) are performed as needed; then, the process waits for the next command. Alternatively, the process may be caused to return to step S201 to repeat the flow from step S201 onward.

When it is determined in step S206 that the reflected light amount has reached the first predetermined level, and thereupon, the laser output is temporarily shut off or reduced (step S212), it is determined that a finite error of a certain magnitude has occurred as a result of the light output command data; then, the learning model is updated (step 210), and the process returns to step S201 to repeat the flow from step S201 onward. If necessary, the result-attached (labeled) data, if any, may be additionally recorded to the result-attached (labeled) data recording unit 18.

By repeating the above steps S201 to S212, the learning unit 11 performs learning by repeatedly updating the learning model.

As earlier noted, the neural network method is an effective learning method not only in reinforcement learning but also in supervised learning, and it is desirable that the machine learning apparatus 8 include a neural network.

The above description has been given by taking the data (output light amount and reflected light amount) output from the output light detecting unit 6 and the reflected light detecting unit 7 as a typical example of the data (state data) to be input to the state data observing unit 9 and the light output command (laser beam output, peak output, pulse width, pulse spacing, pulse repetition frequency, etc.) to be issued to the laser power supply unit 4 as a typical example of the light output command contained in the light output command data output from the decision making unit 12 to the control apparatus 13. However, the state data to be input to the state data observing unit 9 and the command data contained in the light output command data output from the decision making unit 12 to the control apparatus 13 are not specifically limited to the data described hereinabove; for example, data such as the kind of gas, purity of gas, composition of gas, gas outlet pressure, and gas flow rate can be acquired or commanded as assist gas conditions. Further, for the laser optical system 5, data such as transmittance, focal length, F value, the spot size of the laser beam 14 focused on the surface of the workpiece, the relative positional relationship between the surface of the workpiece and the focused point of the laser beam, that is, the distance between the surface of the workpiece and the focused point of the laser beam, including information indicating whether or not the focused point of the laser beam is located in a direction away from the surface of the workpiece and the distance of the focused point of the laser beam from a reference point in a direction parallel to the surface of the workpiece, and the incident angle of the laser beam 14 relative to the surface of the workpiece, can be acquired or commanded. These pieces of data are not limited to fixed values but may be variable values. For example, in the case where the laser beam 14 is applied from the machining head, it is possible to output the light output command data for applying the laser beam 14 that can achieve the output light amount, such as shown in FIGS. 2 to 7, while varying the distance between the surface of the workpiece and the focused point of the laser beam with time, for example, by moving the machining head or by changing the curvature of AO (adaptive optics) or the focal length of the zoom lens system contained in the machining head. Needless to say, if it is desired to obtain the desired output light amount at the output end of the laser optical system 5, the light output command should be issued to the laser power supply unit 4 by also taking into account the transmittance of the laser optical system 5 or the attenuation of the output light amount through the laser optical system 5.

It is also desirable to acquire, as part of the state data, any data, such as the temperature of the workpiece 2, ambient temperature, or ambient humidity, that can affect the result of the light output command data.

Further, a bar code containing information such as the material and thickness of the workpiece 2 may be attached to a designated position on the workpiece 2, and the information of the workpiece 2 may be automatically read by a bar code reader or the like and input as one of the state data to the state data observing unit 9. It is, of course, possible to manually enter the information of the workpiece 2, but it is desirable that the information of the workpiece 2 be made automatically readable so that the learning can be performed without human intervention.

By extensively collecting the data that can affect the result of the light output command data and that is input to the state data observing unit 9, and thereby expanding the range and choices of data to be commanded by the light output command data, it becomes possible to accurately establish the states of the laser apparatus 1, the workpiece 2, and the environment surrounding them, and as a result, it becomes possible to issue the light output command data that better suit the states, thus making it possible to succeed in starting the machining even under conditions where it is difficult to start the machining.

To increase the number of effective data to be input to the state data observing unit 9, two or more reflection light detecting units 7 may be provided. For example, when the laser optical system 5 is constructed from an optical fiber, the ratio between the reflected light 15 propagating through the core and the reflected light 15 propagating through the clad is not always constant; in this case, if two reflection light detecting units 7 are provided, one for measuring the amount of the reflected light 15 propagating through the core and the other for measuring the amount of the reflected light 15 propagating through the clad, the state of the reflection can be identified more closely, making it possible to output more appropriate light output command data.

Further, to increase the number of effective data to be input to the state data observing unit 9, the laser apparatus 1 may further include a light source different from the laser oscillator 3, a light detector for detecting light from the light source, and an optical system through which the light from the light source is applied to the workpiece 2 and through which the light reflected from the surface of the workpiece 2 is incident on the light detector, so that the state of the light reflected from the workpiece 2 can be observed even when the laser beam 14 from the laser oscillator 3 is not output, and the result of the observation may be input as one of the state data to the state data observing unit 9. In this way, information concerning the surface state of the workpiece 2, such as the reflectance of the workpiece surface, can be obtained even when the laser beam 14 for machining is not output, and the probability of being able to output the laser output command highly likely to succeed in starting the machining on the first try can be increased. A dedicated optical system may be provided separately, but it is also possible to share the laser beam optical system 5, like the guide light of the laser beam 14. When a dedicated optical system is provided separately, it is also possible to obtain information concerning the distance to the surface of the workpiece 2 by making the light from the light source incident obliquely on the surface of the workpiece 2. When the light from the light source is made incident perpendicular to the surface of the workpiece 2 by using, for example, the shared laser optical system 5, the light source may be constructed from a laser diode, and the distance to the surface of the workpiece 2 may be automatically measured, for example, using the principle of laser ranging, and be input as one of the state data to the state data observing unit 9.

Furthermore, to increase the number of effective data to be input to the state data observing unit 9, the laser apparatus 1 may further include an infrared detecting unit 31 and/or a plasma light detecting unit 32 for detecting infrared and/or plasma light radiated from near a designated position on the workpiece 2 where the laser beam is applied or is intended to be applied, and data acquired by the infrared detecting unit 31 and/or the plasma light detecting unit 32 may be input as one of the state data to the state data observing unit 9. Since the surface temperature of the workpiece 3 can be measured by the infrared detecting unit 31, information such as heat capacity that is affected by the specific heat, heat conductivity, thickness, etc., of the workpiece 3 is obtained by observing the temperature distribution and the rate of temperature change before and after the application of the laser beam, and it thus becomes possible to output more appropriate light output command data. Further, since the plasma light generated from the machined part of the workpiece 3 due to the application of the laser beam 14 can be measured by the plasma light detecting unit 32, information concerning the effect of the application of the laser beam 14 and the material, etc., of the workpiece 3 is obtained, and as a result, more appropriate light output command data can be output.

A plurality of laser apparatus 1 may be provided, and a plurality of machine learning apparatus 8, one for each laser apparatus 1, may be configured to share or exchange data with each other via communication media. By sharing the learning results, learning results with higher accuracy can be obtained in a shorter time, and it thus becomes possible to output more appropriate light output command data.

The machine learning apparatus 8 may reside in a cloud server. In this case, not only can the learning results be shared, but it also becomes possible to apply a GPGPU, a large-scale PC cluster, etc., which are not readily available for use because of cost and size in the case of a single laser apparatus 1, and higher processing can be achieved, serving to enhance the learning speed and the learning accuracy. As a result, it becomes possible to output more appropriate light output command data.

Advantageous Effect of the Invention

In the first invention, if tiny pits or holes are first formed by applying short pulse light to the workpiece 3, the amount of the reflected light 15 from the workpiece 3 decreases, and the machining may be accomplished without any problem, but depending on the material, thickness, surface state, etc., of the workpiece, there arises the problem that the machining cannot be started because of an inability to quickly determine what kind of pulse light should be applied or because of poor reproducibility resulting in the generation of an alarm indicating an excessive amount of reflected light. Further, if the machining cannot be started with the first laser application, it is often desirable to apply without delay the next laser beam 14 deemed optimal by observing the state of the reflected light 15, but there has been the problem that this cannot be accomplished if human intervention is required. According to the first invention, since what kind of pulse light should be applied to enable the machining to be started while reducing the reflected light amount can be learned repeatedly from the state of the reflected light 15, etc., without requiring human intervention, the light output command data accounting for the above state and suitable for starting the machining can be output, and thus the machining can be started reliably within the predefined time period.

In the second invention, since the command for temporarily shutting off or reducing the laser beam output is issued upon detecting that the reflected light amount has reached the first predetermined level which is lower than the second predetermined level, the condition that the reflected light amount does not exceed the second predetermined level can be satisfied, and since the next new light output command data is output immediately thereafter, the laser oscillation is prevented from being interrupted, and the laser beam output is maintained so that the machining can be started.

In the third invention, since the second predetermined level for the reflected light amount is set lower than the alarm level at which the laser oscillator 3 including the optical system is highly likely to be damaged, and since provisions are made to satisfy the condition that the reflected light amount does not exceed the second predetermined level, the laser oscillator 3 and the laser optical system 5 can be reliably prevented from being damaged by the reflected light 15.

In the fourth invention, since the light output command data is output in succession even after failing to start the machining with single-shot light output command data corresponding to a trial shot, not only does the probability of succeeding in starting the machining increase, but the time loss can also be reduced.

In the fifth invention, if the previous light output command data has failed to start the machining, the output data of the reflected light detecting unit 7 obtained for the previous light output command data is utilized so that more appropriate light output command data can be output. If the reflected light amount has exceeded the first predetermined level and reached a level close to the second predetermined level with the previous light output command data, the result can also be fed back to output the next light output command data.

In the sixth invention, the light output command data that enables the machining to be started under the condition that the reflected light amount does not reach the predetermined level can be learned, which is the purpose of the present invention.

In the seventh invention, since the result indicating whether the laser output has successfully been increased, within the predefined time period, to the level commanded by the light output command data necessary or suitable for the machining is acquired as the operation result, learning can be performed that matches the purpose of the present invention.

In the eighth invention, it becomes possible for the learning unit 11 to output the appropriate light output command data suitable for achieving the target, which is an important factor in performing learning so as to be able to issue a light output command data for starting the machining in the shortest possible time while preventing the reflected light amount from exceeding the second predetermined level.

In the ninth invention, it is often not possible to start the machining with a single-shot light output command, and it is not easy to perform learning by simply associating the input with the result, but by performing reinforcement learning that repeats a trial and error procedure in order to maximize the sum of rewards and thereby learning an optimal action pattern, it becomes possible to output a series of optimal light output commands in response to inputs.

In the tenth invention, when the result including the reflected light, amount for the light output command data, for example, the reciprocal of the rate of decrease of the ratio of the reflected light amount to the output light amount or the reciprocal of the speed of decrease of the ratio of the reflected light amount to the output light amount, is defined as an error, and when the rate of decrease of the ratio of the reflected light amount to the output light amount or the speed of decrease of the ratio of the reflected light amount to the output light amount is smaller than a predetermined value (including the case where the rate of decrease or speed of decrease is negative in value, that is, the ratio of the reflected light amount to the output light amount increases, though usually this may not be often the case) or when the reflected light amount has exceeded the first predetermined value, it is determined that a finite error of a certain magnitude has occurred; then, by performing supervised learning so as to bring the error closer to zero, it becomes possible to perform learning so that the light output command data suitable for increasing the light output up to the level that can start the machining in a short time can be output while satisfying the condition that the reflected light amount does not exceed the second predetermined level, which is the final goal.

In the 11th invention, a neural network can be used as not only an approximation algorithm of a value function in reinforcement learning but also an approximation algorithm in supervised learning.

In the 12th invention, by inputting a large number of state data and by including many parameters relating to the laser optical system 5 in the light output command data, it becomes possible to succeed in starting the machining even under conditions where it is difficult to start the machining.

In the 13th invention, using the laser apparatus 1 equipped with the machine learning apparatus 8, it becomes possible to reliably start the machining in a short time under the condition that the reflected light amount does not exceed the second predetermined level.

In the 14th invention, beams of the reflected light 15 propagating through different light paths contain different kinds of information, and by using as many pieces of such information, it becomes possible to output more appropriate light output command data.

In the 15th invention, information concerning the surface state of the workpiece 2, such as the reflectance of the workpiece surface, can be obtained even when the laser beam 14 for machining is not output, and the probability of being able to output the laser output command highly likely to succeed in starting the machining on the first try increases. If the guide light is utilized, there is no need to provide a separate optical system.

In the 16th invention, since the surface temperature of the workpiece 2 can be measured by the infrared detecting unit 31, information such as heat capacity that is affected by the specific heat, heat conductivity, thickness, etc., of the workpiece 2 is obtained by observing the temperature distribution and the rate of temperature change before and after the application of the laser beam. Further, since the plasma light generated from the machined part of the workpiece 2 due to the application of the laser beam 14 can be measured by the plasma light detecting unit 32, information concerning the effect of the application of the laser beam 14 and the material, etc., of the workpiece 2 is obtained. As a result, more appropriate light output command data can be output.

In the 17th invention, by sharing the learning results, learning results with higher accuracy can be obtained in a shorter time, and it thus becomes possible to output more appropriate light output command data.

In the 18th invention, not only can the learning results be shared, but it also becomes possible to perform learning using a costly high-performance processor, which serves to enhance the learning speed and the learning accuracy. As a result, it becomes possible to output more appropriate light output command data.

In the 19th invention, it is often not possible to start the machining with single-shot light output command data, and it is not easy to perform learning by simply associating the input with the result, but by performing reinforcement learning that repeats a trial and error procedure in order to maximize the sum of rewards and thereby learning an optimal action pattern, it becomes possible to output a series of optimal light output commands in response to inputs.

In the 20th invention, the result including the reflected light amount for the light output command data, for example, the reciprocal of the rate of decrease of the ratio of the reflected light amount to the output light amount and/or the reciprocal of the speed of decrease of the ratio of the reflected light amount to the output light amount, is defined as the error, and by performing supervised learning so as to bring the error closer to zero, it becomes possible to learn the light output command data that maximizes the rate of decrease of the ratio of the reflected light amount to the output light amount and/or the speed of decrease of the ratio of the reflected light amount to the output light amount, which is fundamental but of utmost importance. When the rate of decrease of the ratio of the reflected light amount to the output light amount or the speed of decrease of the ratio of the reflected light amount to the output light amount is smaller than a predetermined value (including the case where the rate of decrease or speed of decrease is negative in value, that is, the ratio of the reflected light amount to the output light amount increases, though usually this may not be often the case) or when the reflected light amount has exceeded the first predetermined value, it is preferable to determine that a finite error of a certain magnitude has occurred. By thus defining the error in the supervised learning, the light output command data can be learned that rapidly reduces the reflectance ($\propto$ the ratio of the reflected light amount to the output light amount) while satisfying the condition that the reflected light amount does not exceed the first predetermined level. Then, using the result of the learning, it becomes possible to perform further advanced learning so that the light output command data suitable for increasing the light output up to the level that can start the machining in a short time can be output while satisfying the condition that the reflected light amount does not exceed the second predetermined level, which is the final goal.

While the present invention has been described with reference to the typical embodiments thereof, it will be understood by those skilled in the art that the above and various other changes, omissions, and additions can be made without departing from the scope of the present invention.

The invention claimed is:

1. A machine learning apparatus for learning light output command data containing a light output command to be issued to a laser power supply to start machining, for use in a laser apparatus comprising at least one laser oscillator for performing machining such as cutting or welding by applying a laser beam to a workpiece and a laser power supply for supplying power to the laser oscillator, the machine learning apparatus comprising:

a processor configured to:
  observe state data of the laser apparatus, including data output from an output light detecting sensor for measuring an output light amount which is the amount of the laser beam output from the laser oscillator by passing through a laser optical system, and data output from a reflected light detecting sensor for measuring a reflected light amount which is the amount of reflected light, the reflected light being the laser beam, reflected from a surface of the workpiece back into the laser oscillator or the laser optical system;
  acquire a success/failure result indicating whether the machining has been started successfully by the laser beam that the laser oscillator output based on the light output command data;
  learn the light output command data containing the light output command to the laser power supply by associating the light output command data with the state data of the laser apparatus and the success/failure result of the machining start;
  determine the light output command data containing the light output command to the laser power supply by referring to the light output command data;
  learn the light output command data for starting the machining on the workpiece by:
    a) determining whether the machining is started within a predefined time period while satisfying a condition that the reflected light amount does not exceed a first predetermined level which is set lower than an alarm level corresponding to a light amount above which the reflected light amount is likely to damage the laser oscillator or the laser optical system,
    b) when the machining is started within the predefined time period while satisfying the condition, increase a reward for the machine learning apparatus, an amount of the increase increases as the start time of the machining decreases,
    c) when the machining is not started within the predefined time period while satisfying the condition, decrease the reward for the machine learning apparatus,
    d) update the light output command data to increase the reward for the machine learning apparatus,
    e) when the reflected light amount obtained from the output data of the reflected light detecting sensor has reached the first predetermined level, issue a command for temporarily shutting off or reducing the laser beam output to the laser power supply even when the laser power supply is in the process of executing the light output command, and re-output a new next output command that instructs the laser power supply to gradually increase the laser beam, and f) repeat steps (a)-(e) a plurality of times; and
control the laser power supply based on the light output command data to perform the machining.

2. The machine learning apparatus according to claim 1, wherein the processor outputs the light output command data by determining the light output command data substantially in succession in a time series manner, at least during the predefined time period, until succeeding in starting the machining.

3. The machine learning apparatus according to claim 1, wherein the processor utilizes the output data of the reflected light detecting sensor.

4. The machine learning apparatus according to claim 1, wherein the success/failure result of the machining start to be acquired by the processor is given in the form of a result indicating whether or not the light output command data that substantially coincides with the light output command data necessary or suitable for the machining of the workpiece has been successfully output within the predefined time period.

5. The machine learning apparatus according to claim 1, wherein the processor acquires at least one of results which include the success or failure of the machining start, the time required to start the machining, the number of times that, or the frequency with which, the reflected light amount reached the first predetermined level, and an amount corresponding to a time-integrated value of an amount by which the reflected light amount exceeded the first predetermined level.

6. The machine learning apparatus according to claim 1, wherein the processor calculates a reward based on the result, and a value function that determines a value of the light output command data, and updates the value function based on the reward.

7. The machine learning apparatus according to claim 1, wherein the processor includes a learning model for learning the light output command data, and the processor calculates an error based on the result and on the learning model, and updates the learning model based on the error.

8. The machine learning apparatus according to claim 1, wherein the machine learning apparatus includes a neural network.

9. The machine learning apparatus according to claim 1, wherein the state data and/or the light output command data include at least one of the following: laser beam output, peak output, pulse width, pulse spacing, repetition frequency, number of repetitive pulses, assist gas spraying conditions, transmittance, focal length, and an F value of the laser optical system, spot size of the laser beam focused on the surface of the workpiece, relative positional relationship between the surface of the workpiece and the focused point of the laser beam, incident angle of the laser beam relative to the surface of the workpiece, temperature of the workpiece, ambient temperature, and ambient humidity.

10. A laser apparatus equipped with the machine learning apparatus of claim 1, comprising: the laser oscillator; the laser power supply; the laser optical system; the output light detecting sensor; the reflected light detecting sensor; and a control apparatus which controls the laser oscillator, the laser power supply, the laser optical system, the output light detecting sensor, and the reflected light detecting sensor independently of each other.

11. The laser apparatus according to claim 10, wherein the laser apparatus includes at least two or more reflected light detecting sensors, and at least one reflected light detecting sensor for detecting each of a plurality of reflected lights propagating through different light paths.

12. The laser apparatus according to claim 10, wherein the laser apparatus includes a light source different from the laser oscillator, a light detector for detecting light from the light source, and an optical system through which the light from the light source is applied to the workpiece and through which the light reflected from the surface of the workpiece is incident on the light detector, so that a state of the light reflected from the workpiece can be observed even when the laser beam from the laser oscillator is not output, and a result of the observation is utilized as one of the state data.

13. The laser apparatus according to claim 10, wherein the laser apparatus includes an infrared detecting sensor and/or a plasma light detecting sensor for detecting infrared and/or plasma light radiated from near a designated position on the workpiece where the laser beam is applied or is intended to be applied, and data acquired by the infrared detecting sensor and/or the plasma light detecting sensor is utilized as one of the state data.

14. The laser apparatus according to claim 10, wherein there exist a plurality of the laser apparatus, and a plurality of the machine learning apparatus, which are provided one for each of the laser apparatus, are configured to share or exchange data with each other via communication media.

15. The laser apparatus according to claim 14, wherein the machine learning apparatus resides in a cloud server.

16. A machine learning method for learning light output command data which contains a light output command to a laser power supply for starting machining of a workpiece by a laser beam within a predefined time period while satisfying a condition that a reflected light amount does not exceed a first predetermined level which is set lower than an alarm level corresponding to a light amount above which the reflected light amount is likely to damage a laser oscillator and/or a laser optical system, the machine learning method comprising:

observing, by a processor, state data of a laser apparatus, including data output from an output light detecting sensor for measuring for measuring an output light amount, which is an amount of a laser beam output, and data output from a reflected light detecting sensor for measuring the reflected light amount;

acquiring, by the processor, a success/failure result indicating whether the machining has been started successfully by the laser beam;

receiving, by the processor, the acquired success/failure result of the machining start effected by the laser beam;

learning, by the processor, the light output command data containing the light output command to the laser power supply by associating the light output command data with the state data of the laser apparatus and the success/failure result of the machining start;

learning, by the processor, the light output command data for starting the machining on the workpiece by:

a) determining whether the machining is started within a predefined time period while satisfying a condition that the reflected light amount does not exceed the first predetermined level, b) when the machining is started within the predefined time period while satisfying the condition, increase a reward for the machine learning method, an amount of the increase increases as the start time of the machining decreases, c) when the machining is not started within the predefined time period while satisfying the condition, decrease the reward for the machine learning method,
d) update the light output command data to increase the reward for the machine learning method, and
e) when the reflected light amount obtained from the output data of the reflected light detecting sensor has reached the first predetermined level, issue a command for temporarily shutting off or reducing the laser beam output to the laser power supply even when the laser power supply is in the process of executing the light output command, and re-output a new next output command that instructs the laser power supply to gradually increase the laser beam, and
f) repeat steps (a)-(e) a plurality of times; and
controlling, by the processor, the laser power supply based on the light output command data to perform the machining.

17. A machine learning method for learning light output command data which contains a light output command to a laser power supply for starting machining of a workplace by a laser beam within a predefined time period while satisfying a condition that a reflected light amount does not exceed a first predetermined level which is set lower than an alarm level corresponding to a light amount above which the reflected light amount is likely to damage a laser oscillator or a laser optical system, the machine learning method comprising:

observing, by a processor, state data of a laser apparatus, including data output from an output light detecting sensor for measuring for measuring an output light amount, which is an amount of a laser beam output, and data output from a reflected light detecting sensor for measuring the reflected light amount;

acquiring, by the processor, a result for the light output command data, the result including the reflected light amount detected from the workpiece;

learning, by the processor, the light output command data containing the light output command to the laser power supply by associating the light output command data with the state data of the laser apparatus and the result of the light output command data including the reflected light amount;

learning, by the processor, the light output command data for starting the machining on the workpiece by:
a) determining whether the machining is started within a predefined time period while satisfying a condition that the reflected light amount does not exceed a first predetermined level,
b) when the machining is started within the predefined time period while satisfying the condition, increase a reward for the machine learning method, an amount of the increase increases as the start time of the machining decreases,
c) when the machining is not started within the predefined time period while satisfying the condition, decrease the reward for the machine learning method,
d) update the light output command data to increase the reward for the machine learning method, and
e) when the reflected light amount obtained from the output data of the reflected light detecting sensor has reached the first predetermined level, issue a command for temporarily shutting off or reducing the laser beam output to the laser power supply even when the laser power supply is in the process of executing the light output command, and re-output a new next output command that instructs the laser power supply to gradually increase the laser beam, and
f) repeat steps (a)-(e) a plurality of times; and
controlling, by the processor, the laser power supply based on the light output command data to perform the machining.

* * * * *